United States Patent [19]
Dennison et al.

[11] Patent Number: 5,858,821
[45] Date of Patent: *Jan. 12, 1999

[54] METHOD OF MAKING THIN FILM TRANSISTORS

[75] Inventors: Charles H. Dennison; Monte Manning, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 706,641

[22] Filed: Sep. 5, 1996

Related U.S. Application Data

[63] Continuation of Ser. No. 132,705, Oct. 6, 1993, abandoned, which is a continuation-in-part of Ser. No. 61,402, May 12, 1993, abandoned.

[51] Int. Cl.[6] .................................................. H01L 21/336
[52] U.S. Cl. ........................ 438/158; 438/161; 438/257; 438/259; 438/270; 438/488
[58] Field of Search ..................................... 438/157, 158, 438/161, 155, 183, 200, 488, 257, 259, 270, 272

[56] References Cited

U.S. PATENT DOCUMENTS

| | | | |
|---|---|---|---|
| 4,586,064 | 4/1986 | Esser et al. | 357/23.4 |
| 4,988,638 | 1/1991 | Huang | 437/57 |
| 5,047,360 | 9/1991 | Nicholas | 437/40 |
| 5,112,765 | 5/1992 | Cederbaum et al. | 437/41 |
| 5,118,639 | 6/1992 | Roth et al. | 437/41 |
| 5,213,990 | 5/1993 | Rodder | 437/40 |
| 5,238,857 | 8/1993 | Sato et al. | 437/21 |
| 5,241,193 | 8/1993 | Pfiester et al. | 438/158 |
| 5,266,507 | 11/1993 | Wu | 257/66 |
| 5,273,921 | 12/1993 | Neudeck et al. | 438/157 |
| 5,279,980 | 1/1994 | Hikichi et al. | |
| 5,286,659 | 2/1994 | Mitani et al. | 437/21 |
| 5,334,862 | 8/1994 | Manning et al. | 438/158 |
| 5,366,909 | 11/1994 | Song et al. | 437/40 |
| 5,376,578 | 12/1994 | Hsu et al. | 437/56 |
| 5,411,909 | 5/1995 | Manning et al. | 438/158 |
| 5,429,962 | 7/1995 | Yang | 437/40 |
| 5,474,941 | 12/1995 | Mitani et al. | 437/21 |
| 5,482,870 | 1/1996 | Inoue | 437/21 |
| 5,498,557 | 3/1996 | Negishi et al. | 438/158 |
| 5,521,107 | 5/1996 | Yamazaki et al. | 437/42 |
| 5,541,126 | 7/1996 | Muragishi | 437/40 |

FOREIGN PATENT DOCUMENTS

| | | |
|---|---|---|
| A-57-85262 | 11/1980 | Japan . |
| 58-33872A | 2/1983 | Japan ..................................... 437/21 |
| 61-252667 | 5/1985 | Japan . |

(List continued on next page.)

OTHER PUBLICATIONS

T. Hashimoto et al., "An 8 nm–thick Polysilicon MOS Transistor and Its Thin Film Effects", Ext. Abs–21st Conf. on Solid State Devices and Materials, Tokyo, 1989 pp. 97–100.

Peters, Laura; "SOI Takes Over Where Silicon Leaves Off"; Semiconductor Int'l Mar. 1993, pp. 48–51.

Colinge, Jean–Pierre; "Some Properties of Thin–Film SOI MOSFET's"; IEEE Circuites and Devices Magazine, 1987 pp. 16–20.

*Primary Examiner*—Mary Wilczewski
*Attorney, Agent, or Firm*—Wells, St. John, Roberts, Gregory & Matkin, P.S.

[57] ABSTRACT

A thin film field effect transistor includes: a) a thin film channel region; b) a pair of opposing electrically conductive first and second source/drain regions adjacent the thin film channel region; c) a gate insulator and a gate positioned adjacent the thin film channel region for electrically energizing the channel region to switch on the thin film field effect transistor; d) the first source/drain region having a first thickness, the second source/drain region having a second thickness, the channel region having a third thickness; at least one of the first and second thicknesses being greater than the third thickness. Methods are disclosed for making thin field effect transistors.

9 Claims, 10 Drawing Sheets

FOREIGN PATENT DOCUMENTS

| | | |
|---|---|---|
| A-2-143462 | 11/1988 | Japan . |
| 3-159250 | 11/1989 | Japan . |
| 3-194937 | 12/1989 | Japan . |
| 2-123743A | 5/1990 | Japan ........................................ 437/21 |
| 2-250333A | 10/1990 | Japan ........................................ 437/21 |
| 5-114734 | 10/1991 | Japan . |
| 4-162537A | 6/1992 | Japan ........................................ 437/21 |
| 4162537A | 6/1992 | Japan . |
| 5-243272A | 9/1993 | Japan ........................................ 437/21 |

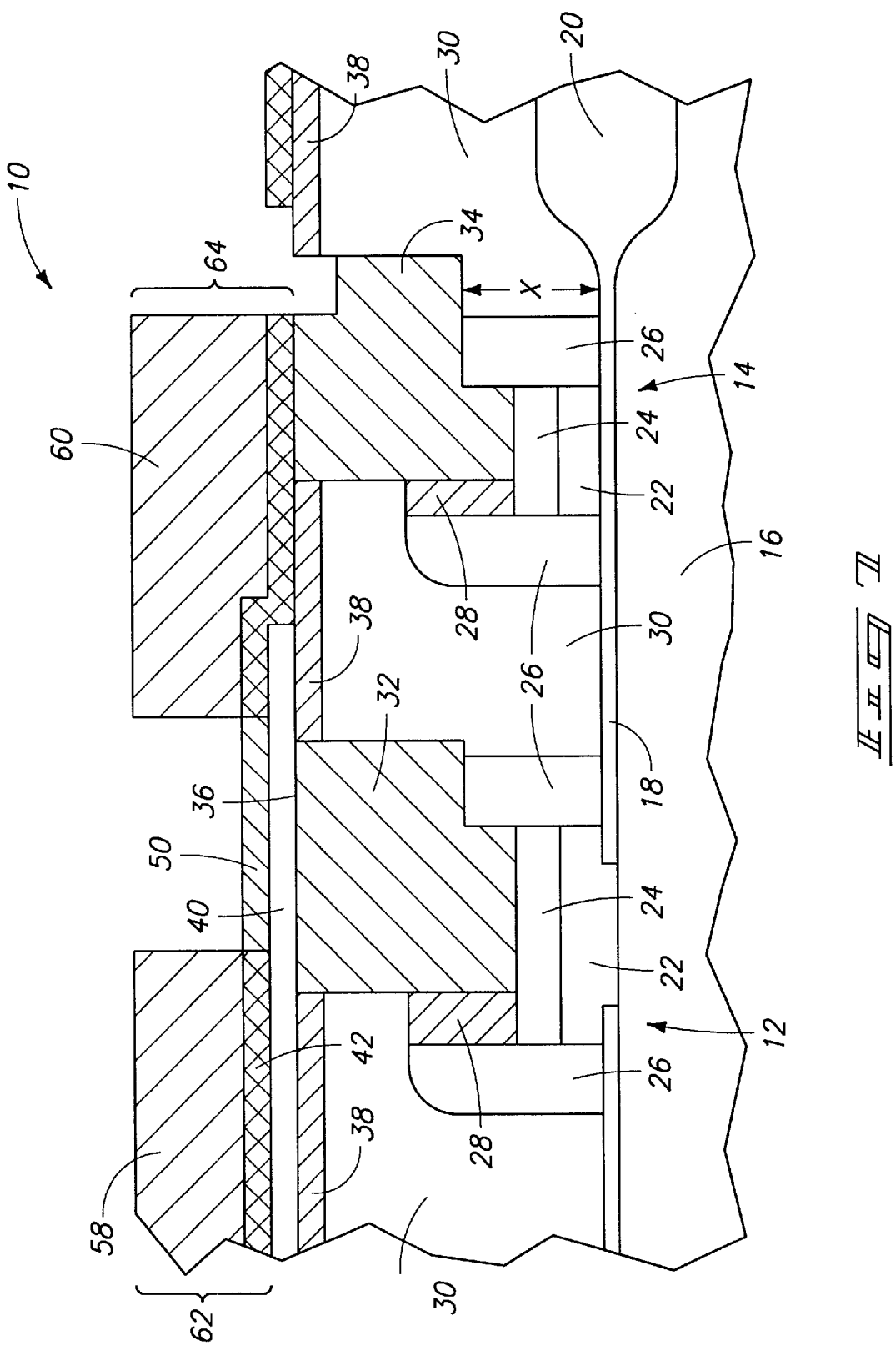

METHOD OF MAKING THIN FILM TRANSISTORS

RELATED PATENT DATA

This patent resulted from a file wrapper continuation application under 37 CFR § 1.60(b) of prior application Ser. No. 08/132,705 filed on Oct. 6, 1993, entitled "Thin Film Transistors and Method of Making", by the following named inventors: Charles H. Dennison and Monte Manning, which was a continuation-in-part application of prior U.S. patent application Ser. No. 08/061,402, filed on May 12, 1993, and entitled "Fully Planarized Thin Film Transistor (TFT) And Process To Fabricate Same", both prior applications now abandoned.

This invention was made with Government support under Contract No. MDA972-92-C-0054 awarded by Advanced Research Projects Agency (ARPA). The Government has certain rights in this invention.

TECHNICAL FIELD

This invention relates specifically to film transistor technology.

BACKGROUND OF THE INVENTION

As circuit density continues to increase, there is a corresponding drive to produce smaller and smaller field effect transistors. Field effect transistors have typically been formed by providing active areas 8 within a bulk substrate material or within a complementary conductivity type well formed within a bulk substrate. One recent technique finding greater application in achieving reduced transistor size is to form field effect transistors with thin films, which is commonly referred to as "thin film transistor" (TFT) technology.

With TFTs, a substantially constant thickness thin film of material (typically polysilicon) is first provided. A central channel region of the thin film is masked, while opposing adjacent source/drain regions are doped with an appropriate p or n type conductivity enhancing impurity. A gate insulator and gate is provided either above or below the thin film channel region, thus providing a field effect transistor having active and channel regions formed entirely within a thin film as opposed to a bulk substrate.

In TFT technology, one goal is to provide the thin film as thin as possible to produce a thin channel region which provides maximized desired on/off characteristics for the transistors. Such, however, adversely affects source/drain region conductance due to diminished volume of material, thus resulting in undesirable elevated Vcc source/drain resistance.

It would be desirable to improve upon methods of forming thin film transistors and in improving thin film transistor constructions.

BRIEF DESCRIPTION OF THE DRAWINGS

Preferred embodiments of the invention are described below with reference to the following accompanying drawings.

FIG. 7 is a diagrammatic section of the FIG. 2 semiconductor wafer taken at a processing step subsequent to that shown by FIG. 5, and positionally representing an X—X cut.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film field effect transistor comprises the following steps:

providing a transistor gate;
  providing a thin film transistor layer comprising first and second source/drain areas separated by an intervening thin film channel region, the thin film channel region being gated by the transistor gate through a gate insulator, the thin film transistor layer having a selected thickness;
  providing a layer of electrically conductive material adjacent the thin film transistor layer;
  patterning and etching the electrically conductive material to define first and second source/drain blocks; and
  the first and second source/drain blocks electrically interconnecting with the respective thin film first and second source/drain areas to define composite first and second source/drain regions having thickness which is greater than the thin film layer thickness.

In accordance with another aspect of the invention, a thin film field effective transistor comprises:

a thin film channel region;
  a pair of opposing electrically conductive first and second source/drain regions adjacent the thin film channel region;
  a gate insulator and a gate positioned adjacent the thin film channel region for electrically energizing the channel region to switch on the thin film field effect transistor;

the first source/drain region having a first thickness, the second source/drain region having a second thickness, the channel region having a third thickness; at least one of the first and second thicknesses being greater than the third thickness.

Figure 1:
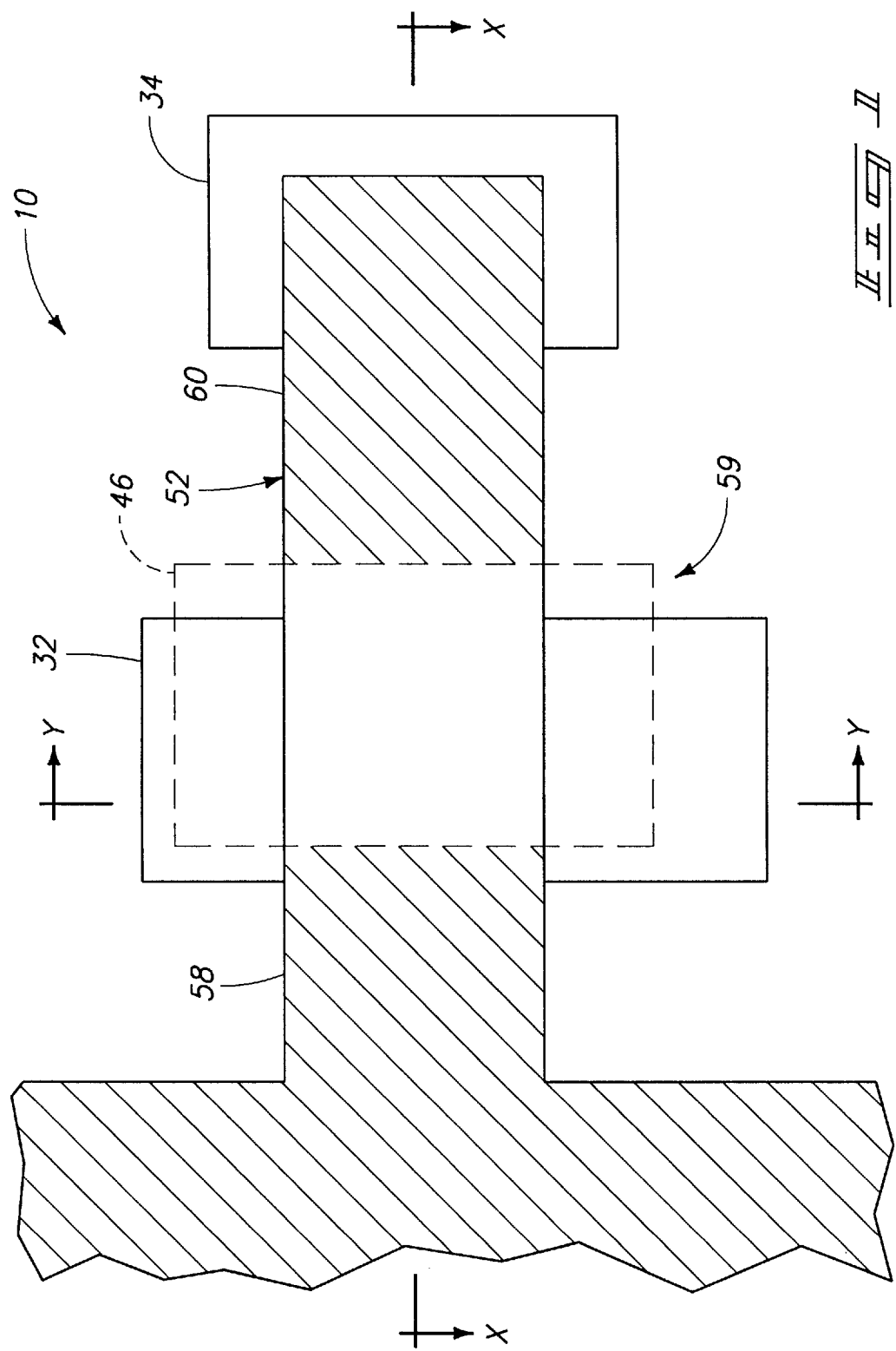
FIG. 1 is a top diagrammatic plan view of a substantially completed portion of a semiconductor substrate provided with a thin film transistor in accordance with the invention.
Figure 2:
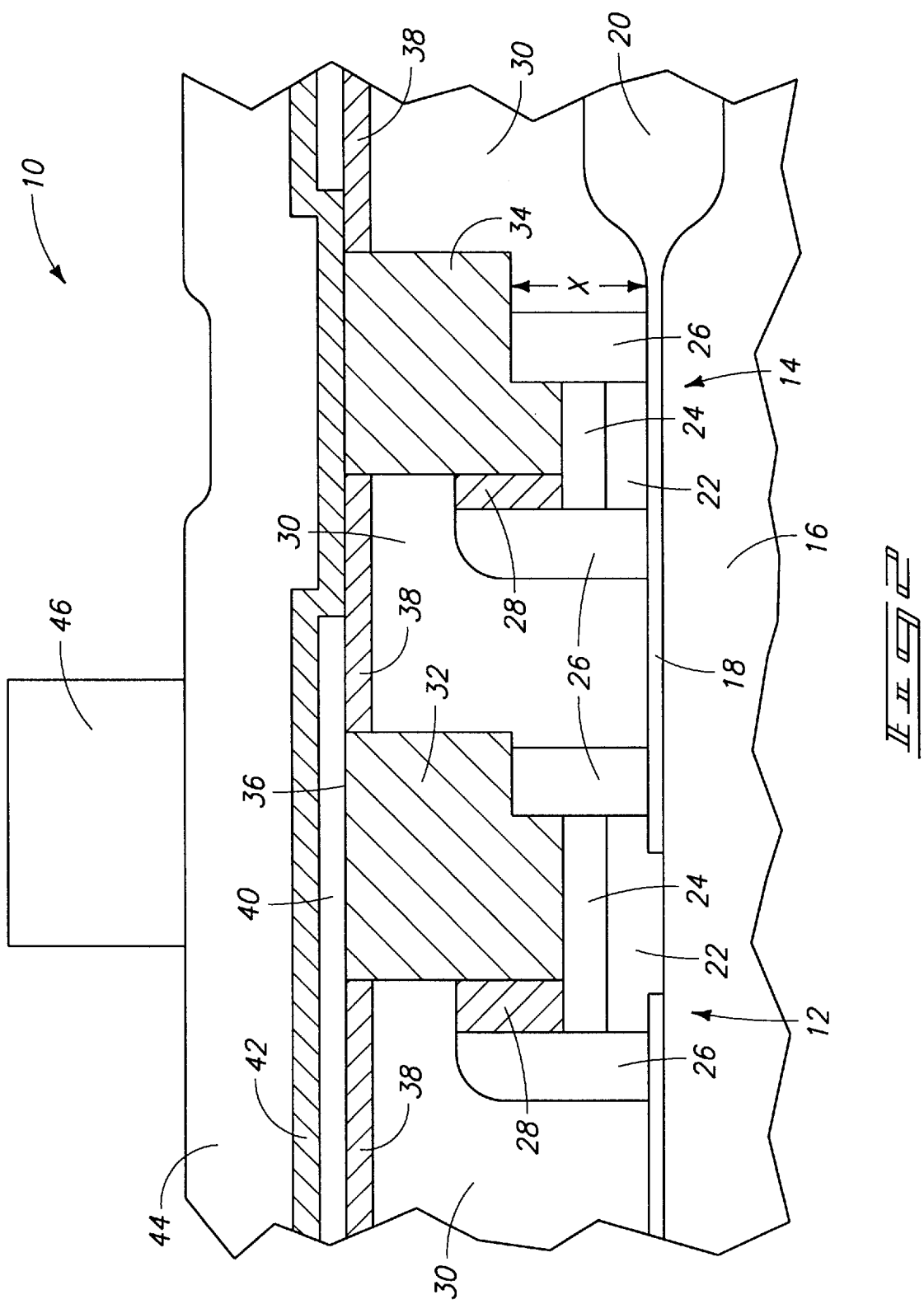
FIG. 2 is a view of a semiconductor wafer fragment taken at one processing step in accordance with the invention, and positionally corresponds with an X—X line cut through the FIG. 1 plan view, but is taken at a point in time before all the components represented by FIG. 1 have been produced.

Referring first to FIGS. 1–8 and initially to FIG. 2, there illustrated is a semiconductor wafer fragment indicated generally by reference numeral 10. Such illustrates but one portion of a static random access memory (SRAM) cell employing a pair of pull down transistor gates 12 and 14. Such are provided over a bulk semiconductor substrate 16 including an associated gate oxide layer 18 and field oxide region 20. Pull down gates 12 and 14 each comprise conductive polysilicon regions 22 which may be capped with higher conductive material regions 24, such as $WSi_x$. Pull down gates 12 and 14 are also provided with oxide sidewall spacers 26 and nitride caps 28. An insulating layer 30, typically borophosphosilicate glass (BPSG), surrounds or otherwise encapsulates pull down gates 12 and 14. Electrically conductive polysilicon plugs 32 and 34 are provided over pull down gates 12 and 14 to electrically connect with the upper surface of the respective regions 24. For purposes of the continuing discussion, conductive poly plug 32 has an upper surface 36. BPSG layer 30 is capped with a $Si_3N_4$ layer 38.

Conductive polysilicon plug 32 in accordance with the invention is utilized as a transistor gate for a thin film transistor, and more specifically in this described embodiment comprises a bottom gate for producing a bottom gated thin film transistor. FIG. 1 also illustrates an outline 32 representative of the size and shape of the thin film transistor gate. As depicted, at least local planarizing in the vicinity of bottom gate 32 (FIG. 2) has been conducted to provide upper bottom gate surface 36 in a substantially planar form. Planar surface 36 is substantially co-planar with adjacent upper surfaces, such as the upper surfaces of nitride layer 38. A preferred technique for producing the construction as described to this point is disclosed and provided in our U.S. patent application Ser. No. 08/061,402, filed on May 12, 1993, now abandoned, and entitled "Fully Planarized Thin Film Transistor (TFT) And Process To Fabricate Same".

A gate insulator layer 40, preferably $SiO_2$, is provided and patterned as shown. An example thickness would be 300 Angstroms. A thin film transistor layer 42 is provided thereatop. Such preferably comprises polysilicon provided to a thickness of from about 100 Angstroms to about 350 Angstroms. This could be provided by polysilicon deposition, or by deposition of an amorphous silicon followed by a crystallization technique, such as solid phase crystallization.

A masking layer 44, typically $SiO_2$, is deposited to a thickness of about 2,000 Angstroms. Material of layer 44 might ultimately be sacrificial, or portions thereof remain permanently on the wafer. A preferred technique as described below is to utilize all the material of layer 44 ultimately as sacrificial material, such that its composition from an electrically conductive/non-electrically conductive standpoint is immaterial. If the material of layer 44 is ultimately to remain on the produced wafer, it will be provided to be electrically non-conductive to provide satisfactory thin film transistor operation. An example of another material usable for layer 44 is polyimide.

A layer of photoresist is provided, and patterned to produce a masking block 46. The outline of masking block 46 is also viewable in FIG. 1.

Figure 3:
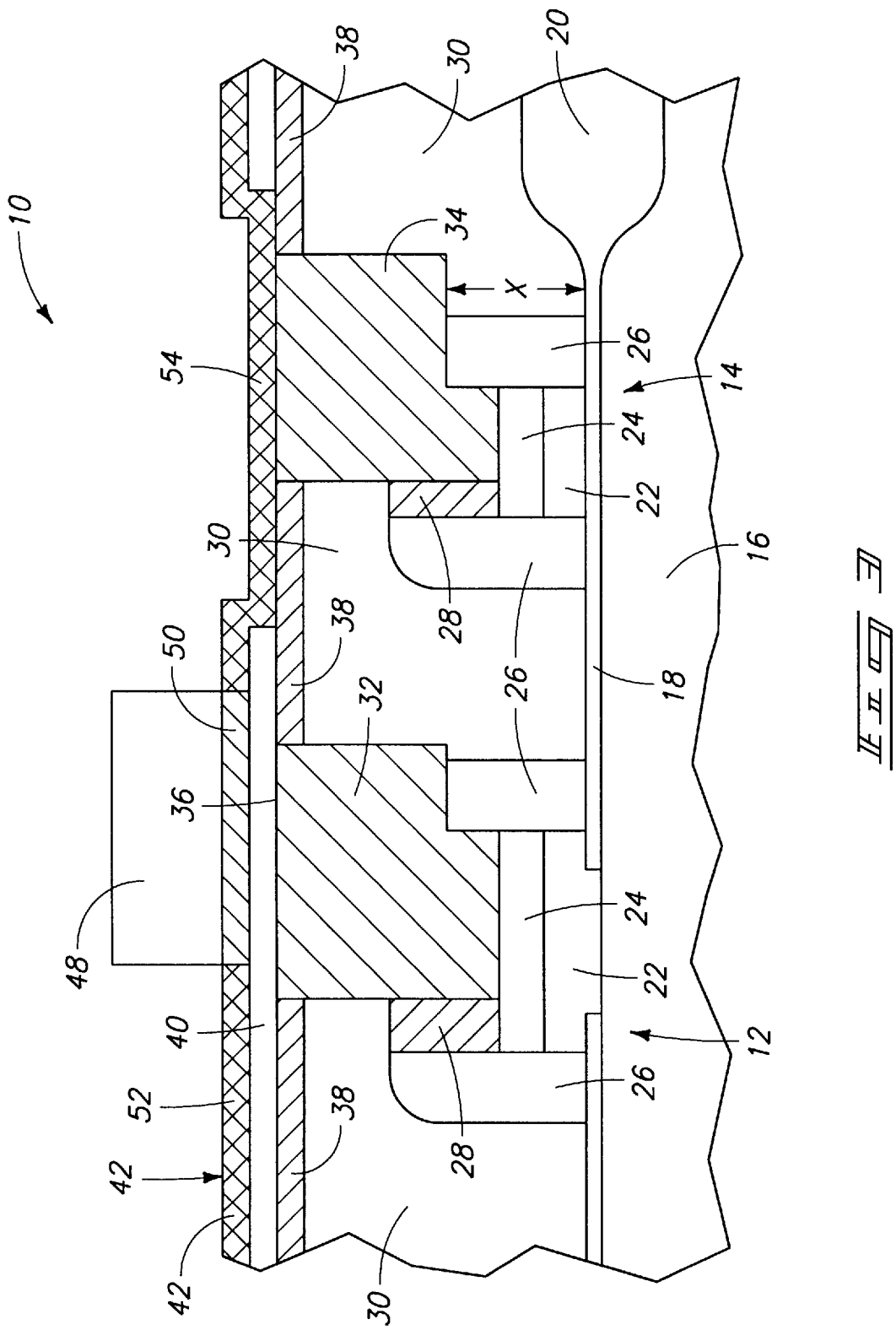
FIG. 3 is a view of the FIG. 2 wafer fragment shown at a processing step subsequent to that shown by FIG. 2.

Referring to FIG. 3, masking block 46 has been utilized during an etch of layer 44 to produce an oxide masking block 48 relative to underlying thin film transistor layer 42. Such covers and defines a thin film channel region 50 as well as first and second opposing source drain areas 52, 54 separated by intervening thin film channel region 50. Oxide mask 48 also upwardly exposes first and second source/drain areas 52, 54, respectively. Thin film transistor layer 42 is preferably conductively doped with a p+ impurity at this point in the process, thus rendering source/drain areas 52 and 54 electrically conductive. Thus, thin film channel region 50 is gateable by bottom transistor gate 32 through gate insulating layer 40.

Figure 4:
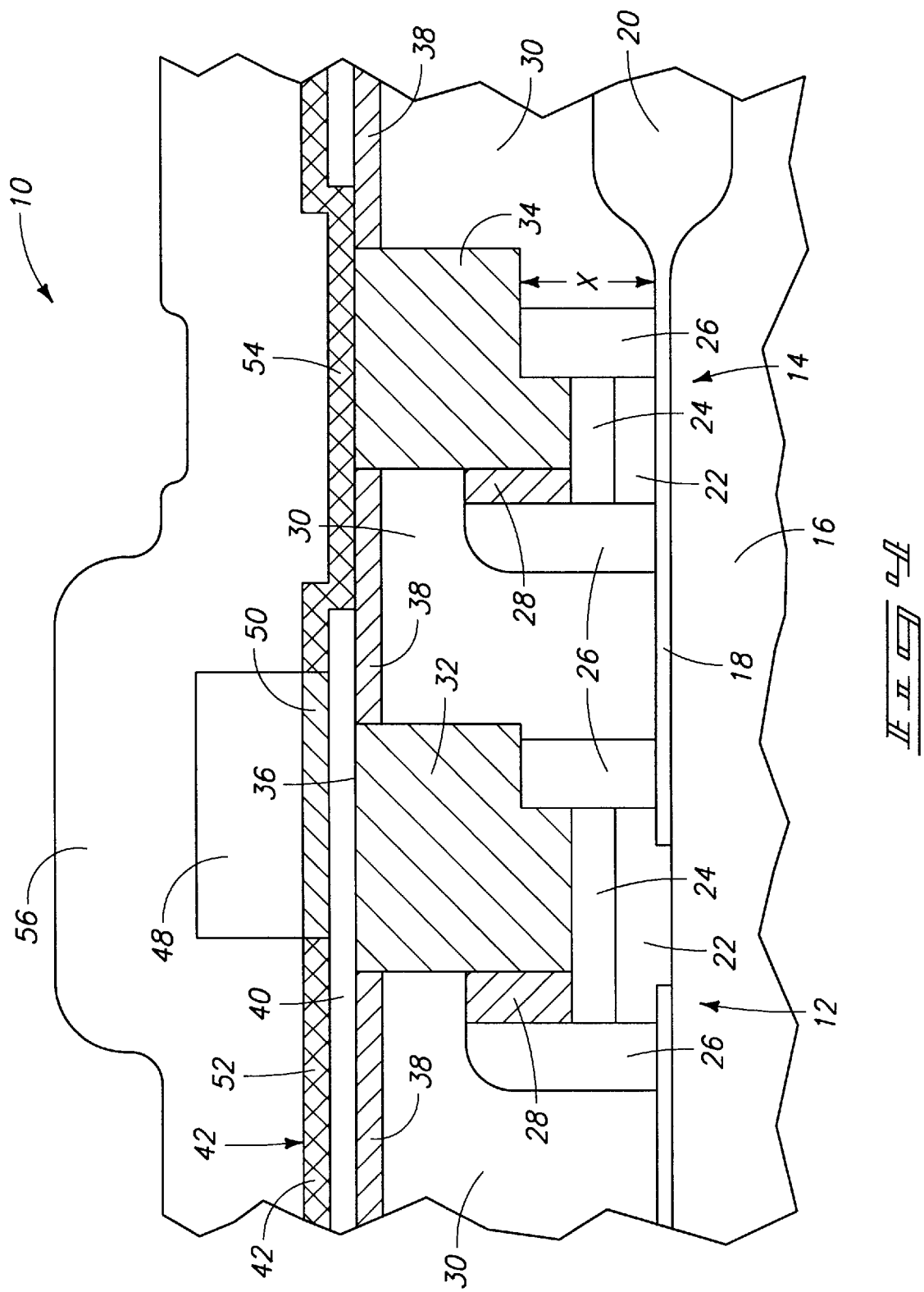
FIG. 4 is a view of the FIG. 2 wafer fragment shown at a processing step subsequent to that shown by FIG. 3.

Referring to FIG. 4, a layer 56 of electrically conductive material, preferably ultimately conductively doped polysilicon, is provided atop and thereby adjacent thin film transistor layer 42 and over oxide mask block 48. An example and preferred thickness for layer 56 is 2,000 Angstroms. Polysilicon layer 56 can be in situ conductively doped or doped subsequent to deposition. Such ultimate doping of layer 56 might effectively also desirably provide doping of underlying first and second source/drain areas 52 and 54 respectively, such that 52 and 54 might not previously be required to be doped in a separate doping step.

Figure 5:
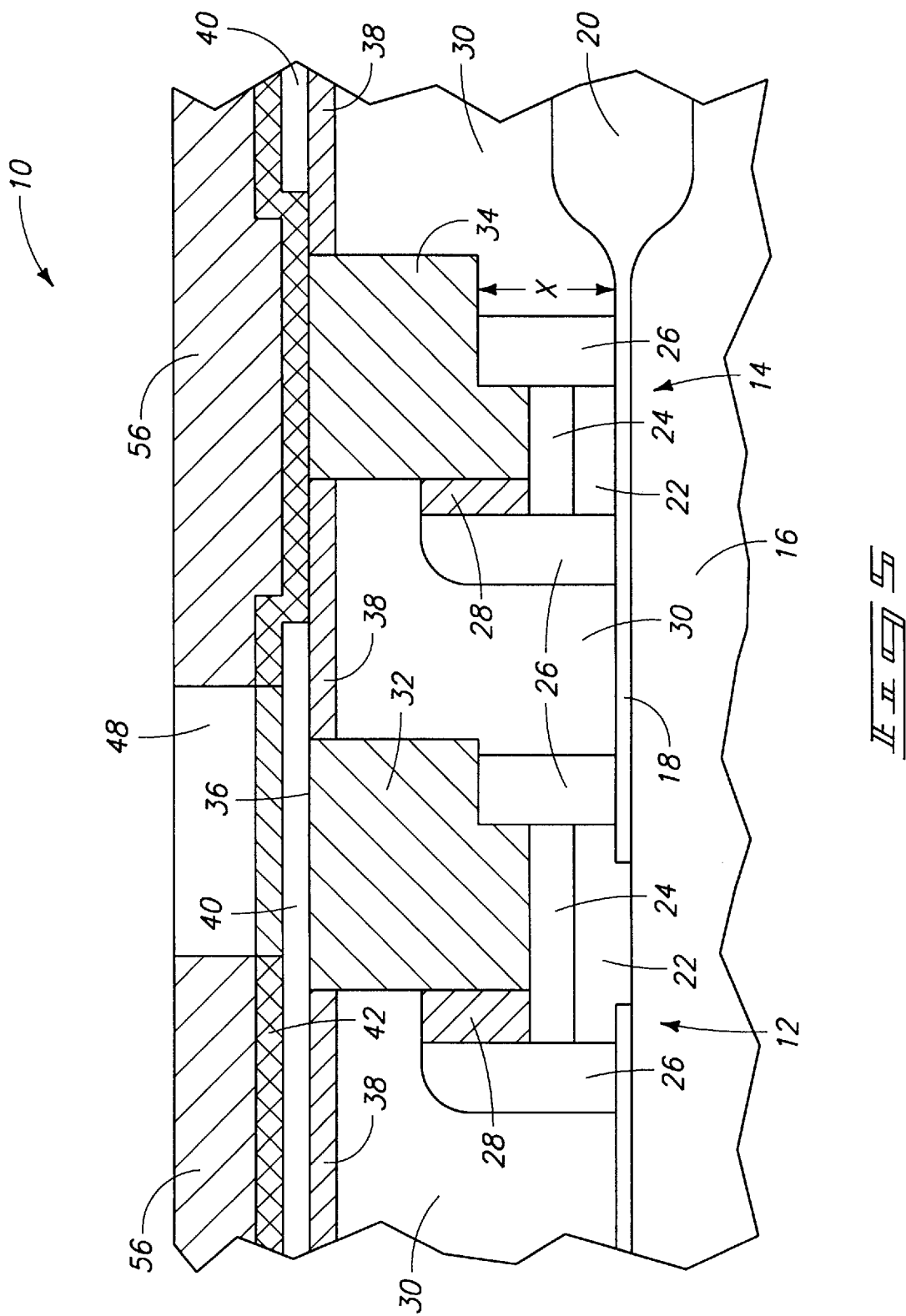
FIG. 5 is a view of the FIG. 2 wafer fragment shown at a processing step subsequent to that shown by FIG. 4.
Figure 6:
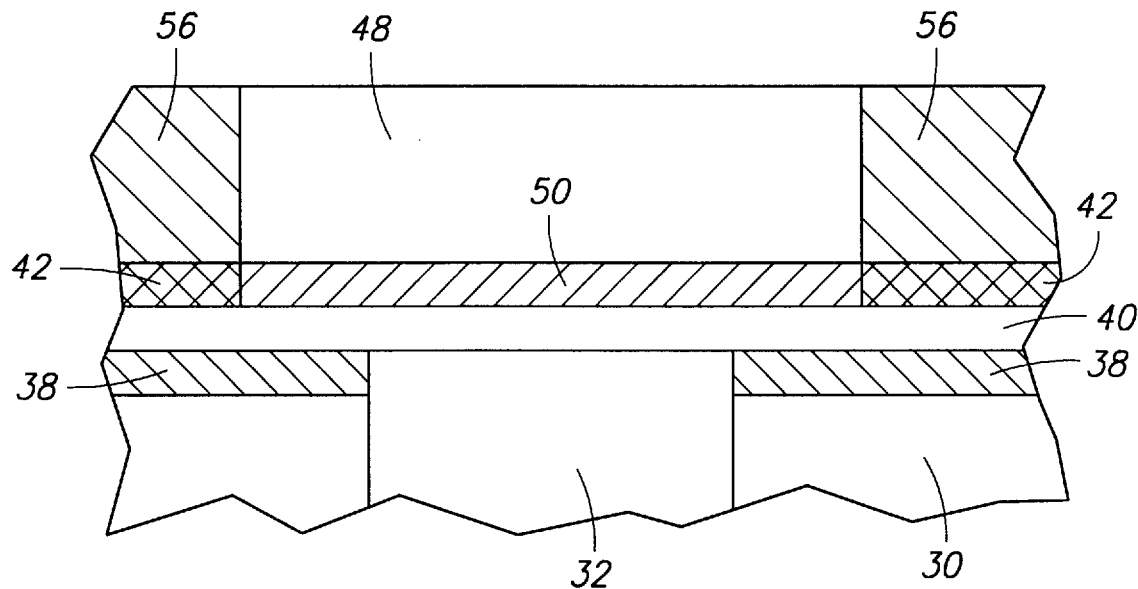
FIG. 6 is a view of the FIG. 2 wafer fragment corresponding in processing sequence to the step shown by FIG. 5, but positionally corresponding with a Y—Y line cut relative to FIG. 1.

Referring to FIG. 5, polysilicon layer 56 is chemical-mechanical polished (CMP) to remove polysilicon from above oxide block 48 and provide a substantially globally planarized upper surface. An example CMP step would be to utilize a slurry comprising KOH, $SiO_2$ particles (silica) and water. FIG. 6 illustrates a FIG. 1 Y—Y positional cut of the wafer at the processing step represented by FIG. 5.

Figure 8:
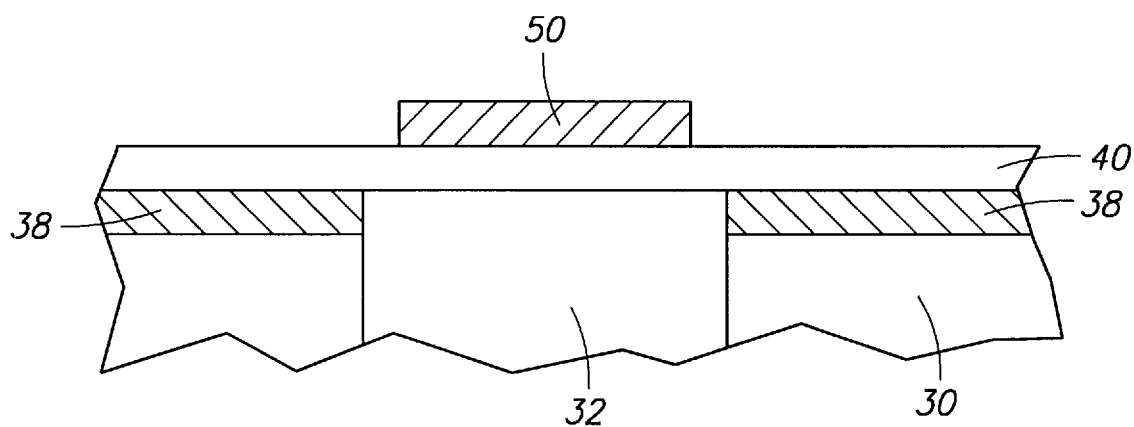
FIG. 8 is a view of the FIG. 7 wafer showing a Y—Y positional cut.

Referring to FIG. 7, oxide block 48 has been wet stripped from the wafer, and polysilicon layer 56 patterned and etched to define first and second source/drain blocks 58 and 60, respectively. FIG. 8 illustrates the Y—Y cut of the wafer at the processing step of FIG. 7, and FIG. 1 as well represents the pattern outline of blocks 58 and 60. As is apparent from at least FIG. 7, first and second source/drain blocks 58, 60 respectively, electrically interconnect with the thin film first and second source/drain areas 52 and 54, respectively. Such defines composite first and second source/drain regions 62, 64 respectively, which have thickness which is greater than the thickness of thin film layer 42 utilized to produce thin film channel region 50.

The above provided method and construction provide a desired advantage of enabling producing a thin film channel region as thin as desirable, while minimizing resistance in source/drain region 62, 64 the result of their greater thickness and thereby greater volume of conductive material for desirable operation of the thus formed thin film transistor.

Figure 9:
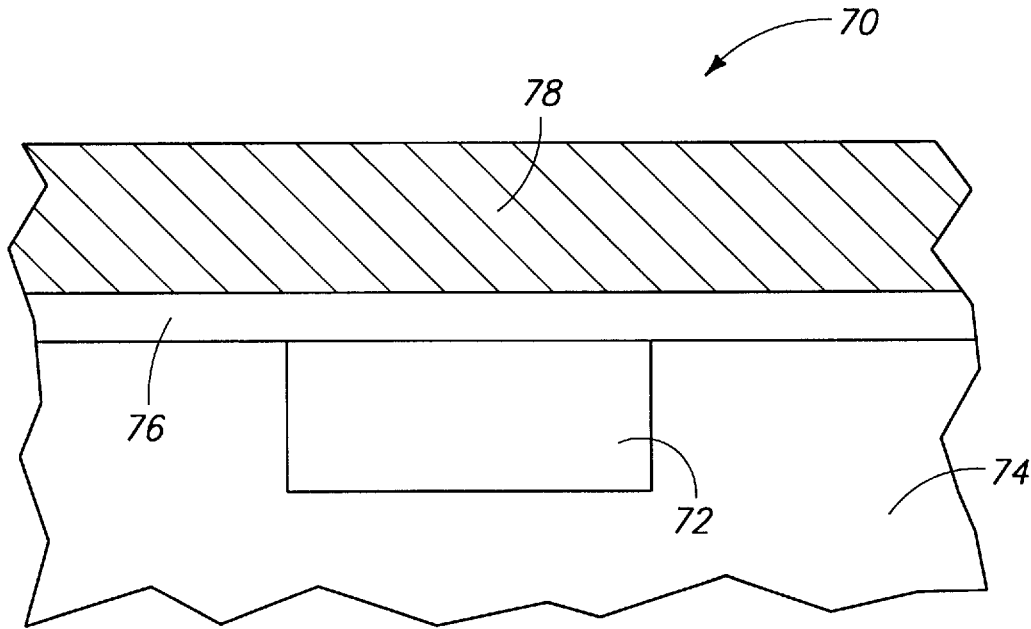
FIG. 9 is a sectional view of an alternate semiconductor wafer fragment processed in accordance with alternate aspects of the invention.
Figure 10:
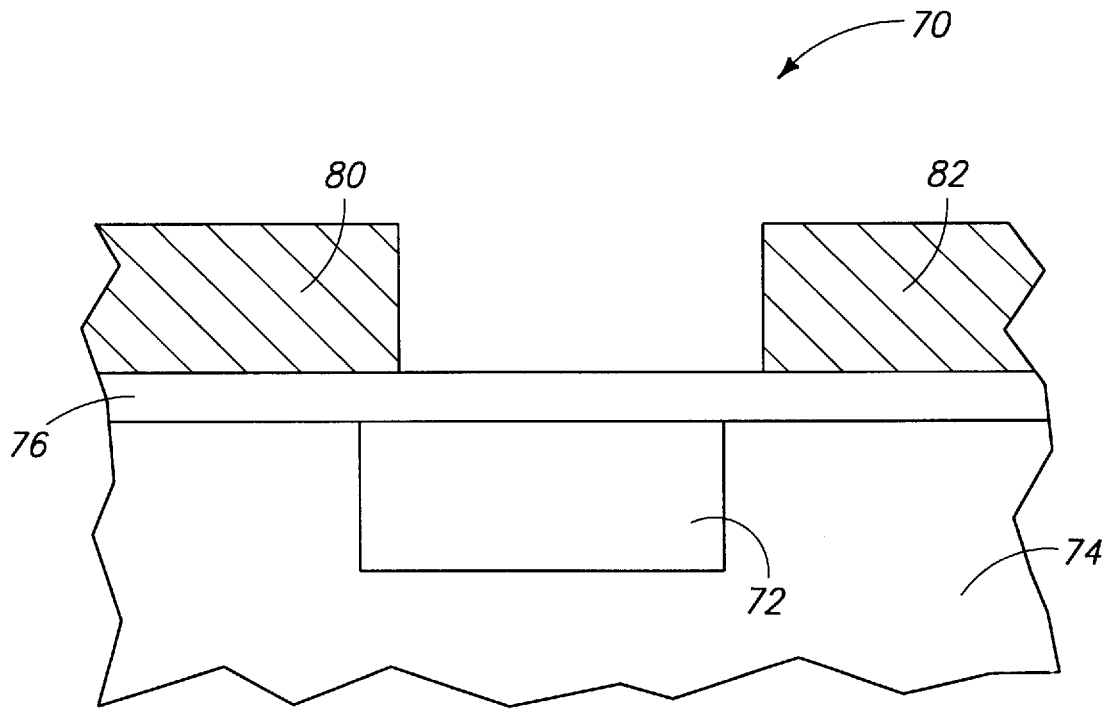
FIG. 10 is a view of the FIG. 9 wafer taken at a processing step subsequent to that shown by FIG. 9.
Figure 11:
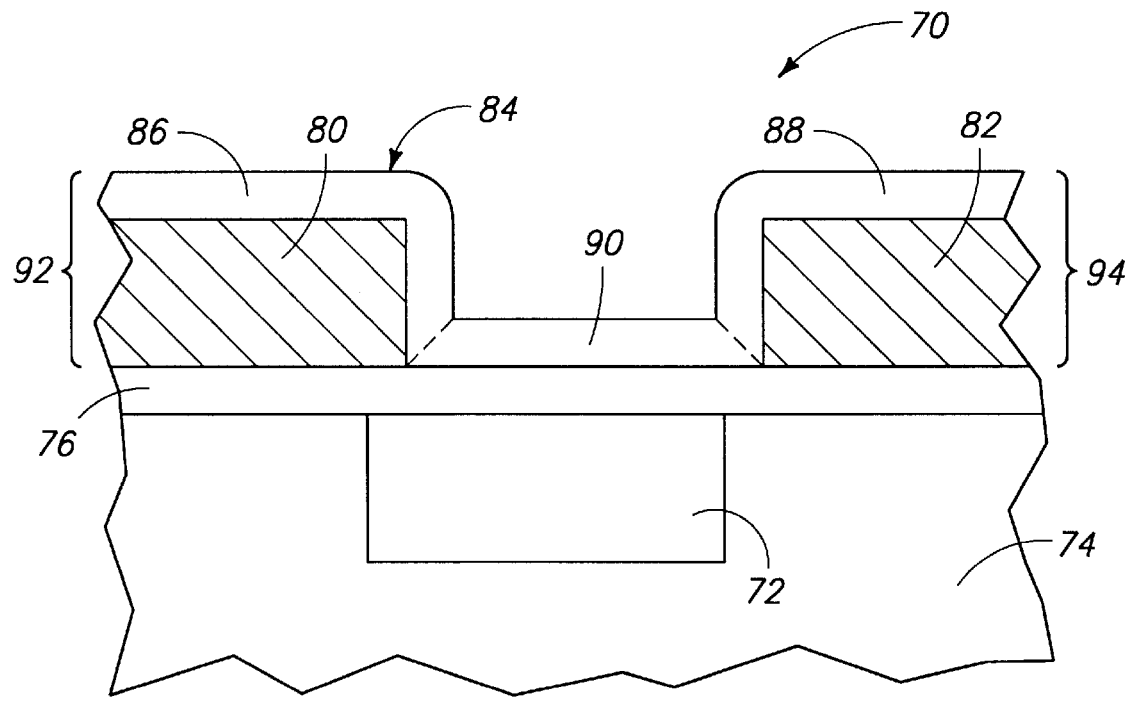
FIG. 11 is a sectional view of the FIG. 9 wafer taken at a processing step subsequent to that shown by FIG. 10.

The invention proceeds with reference to FIGS. 9–11 for description of an alternate embodiment thin film transistor construction and method in accordance with the invention. The FIGS. 1–8 embodiment described a method and construction wherein the thin film transistor layer was provided before the subsequent layer of electrically conductive material was provided and patterned. The embodiment of FIGS. 9–11 shows the opposite, whereby the layer of electrically conductive material is provided and patterned before thin film transistor layer application, and in the context of a bottom-gated thin film transistor. Specifically, FIG. 9 illustrates a semiconductor wafer fragment 70 comprised of a conductive bottom gate 72 formed within a bulk insulating layer 74. A layer 76 of insulating gate dielectric is provided atop insulator 74. A layer 78 of electrically conductive material, preferably polysilicon, is provided atop layer 76.

Referring to FIG. 10, layer 78 has been patterned and etched to produce offset first and second source/drain blocks 80 and 82, respectively.

Referring to FIG. 11, a thin film transistor layer 84 is provided. Such would be patterned and doped to provide first and second respective source/drain areas 86 and 88 respectively, and intervening thin film channel region 90. Thus, such produces first and second source/drain regions 92 and 94 having a thickness which is greater than thin film channel region 90. This is but one example of a bottom-gated thin film transistor in accordance with the invention wherein the layer of electrically conductive material utilized for producing source/drain blocks is provided and patterned before application of the thin film transistor layer.

Figure 12:
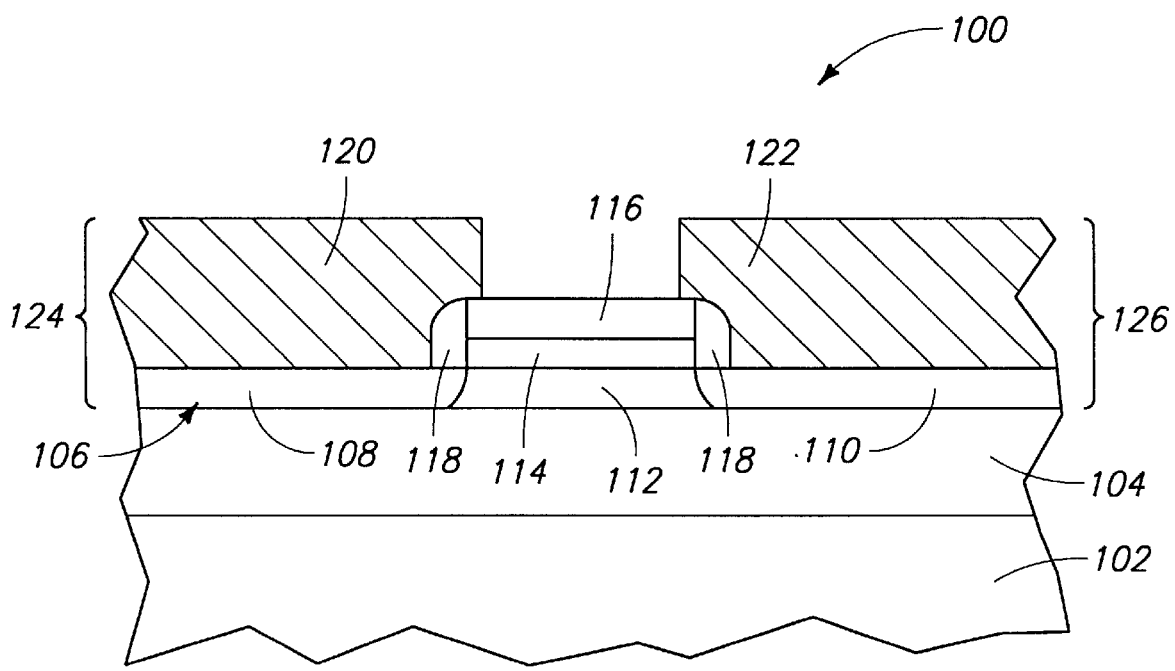
FIG. 12 is a diagrammatic sectional view of a further alternate semiconductor wafer fragment processed in accordance with further alternate methods in accordance with the invention.
Figure 13:
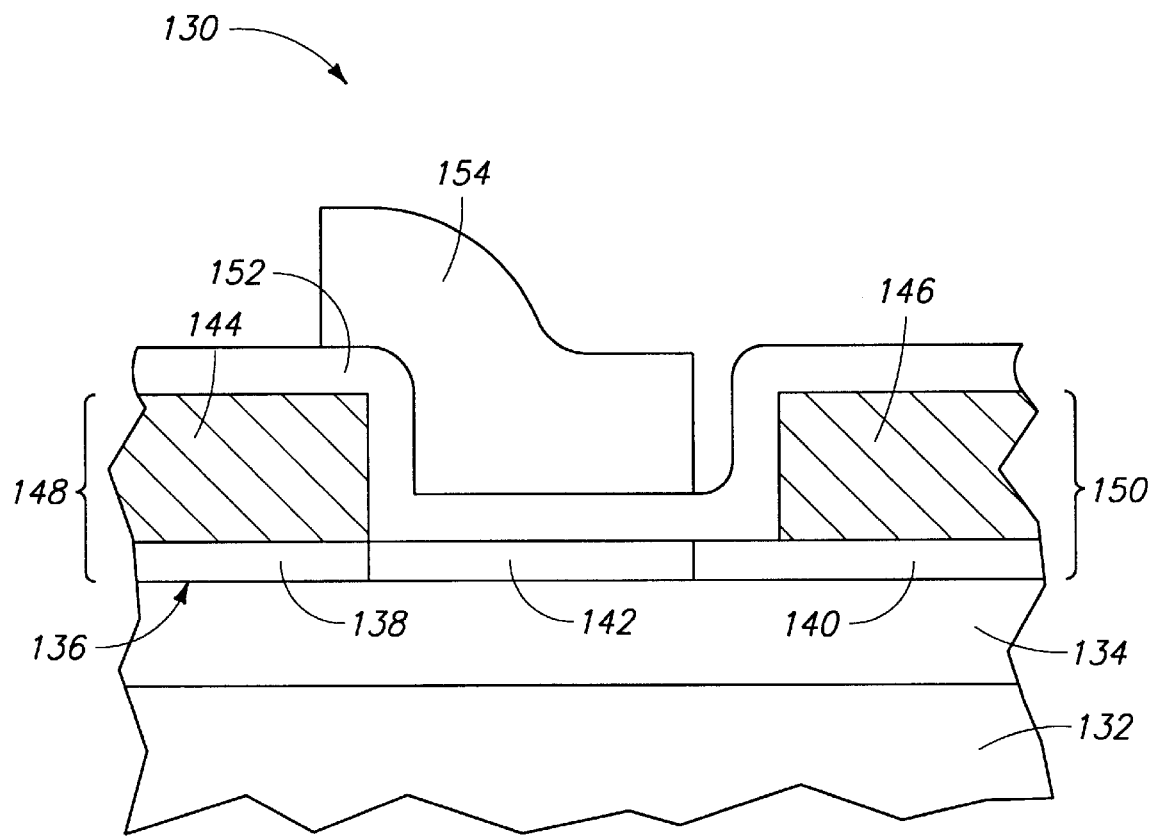
FIG. 13 is a diagrammatic sectional view of still a further alternate embodiment semiconductor wafer fragment processed in accordance with still further alternate techniques in accordance with the invention.

FIGS. 12 and 13 illustrate alternate methods and constructions in accordance with the invention employing top gating in a thin film transistor. Referring first to FIG. 12, there illustrated is a semiconductor wafer fragment generally indicated by reference numeral 100. Such comprises a bulk substrate region 102 and overlying planarized oxide layer 104. A thin film channel layer 106 has been provided, and comprises first and second source/drain areas 108 and 110, respectively, separated by an intervening thin film channel region 112. Thereafter, a top gate insulating layer 114 has been deposited and patterned as shown, in conjunction with depositing and patterning of a gate layer for producing top gate 116. Insulating sidewall spacers 118 would be provided as shown. A layer of electrically conductive material is provided, patterned and etched to define first and second source/drain blocks 120 and 122, respectively. First and second source/drain blocks 120 and 122 respectively, electrically interconnect with the respective thin film first and second source/drain areas 108 and 110 to define composite first and second source/drain regions 124 and 126, respectively. Thus, composite first and second source/drain regions 124 and 126 are defined which have thickness greater than the thin film layer thickness utilized to produce transistor channel region 112.

FIG. 13 illustrates an alternate embodiment wafer fragment generally indicated by reference numeral 130. Such is comprised of a bulk substrate 132 and overlying planarized layer 134 of insulating $SiO_2$. A thin film transistor layer 136 is provided atop oxide layer 134. Thin film transistor layer 136 is comprised of first and second source/drain areas 138 and 140, respectively, which are separated by an intervening thin film channel region 142. Thereafter, a layer of electrically conductive material (typically polysilicon) is provided over thin film transistor layer 136. Such is patterned and etched to define first and second source/drain blocks 144 and 146, respectively. Thus, such blocks electrically interconnect with the respective thin film first and second source/drain areas 138 and 140, thus defining composite first and second source/drain regions 148 and 150 which have a thickness greater than thin film transistor layer 136 thickness.

Subsequently, a gate dielectric layer 152 is deposited. Then, a conductive top gate layer is deposited and patterned to provide a top gate 154.

In each of the above-described embodiments with respect to FIGS. 12 and 13, a top gate conductor is provided. Alternate embodiments could of course be produced and fall within the scope of the existing invention which is only intended to be limited by the concluding claims. By way of example only as one alternate, top gated thin film transistors in accordance with the invention could also of course be produced by first provision of the source/drain blocks, followed by subsequent provision of the thin film transistor layer thereatop.

In accordance with the above-described embodiments, thin film transistors are provided wherein each of the source/drains are provided to have substantially equal and greater thickness than the thin film channel regions. Alternately in accordance with the invention, a thin film field effect transistor could be provided wherein perhaps only one of the source/drain areas is provided with greater thickness, or each of the source/drain areas provided with greater thickness than the channel region, but of differing thicknesses.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a bottom gated thin film field effect transistor comprising the following steps:

providing a bottom gate within a layer of insulating material;

providing first and second electrically conductive source/drain blocks elevationally higher and opposingly adjacent the bottom gate, the source/drain blocks having uppermost surfaces and lateral side surfaces, the lateral side surfaces joining the uppermost surfaces at upper corners;

providing a gate insulating layer over the bottom gate; and providing a thin film transistor layer over the first and second source/drain blocks and gate insulating layer, the thin film transistor layer electrically interconnecting with the first and second conductive source/drain blocks to define a thin film field effect transistor having opposing source/drain regions with a thickness which is greater than an intervening thin film transistor channel region; the thin film transistor layer extending along the uppermost surfaces of the source/drain blocks, around the upper corners of the source/drain blocks, and along the lateral side surfaces of the source/drain blocks.

2. A method of forming a thin film field effect transistor comprising the following steps:

providing a transistor gate;

providing a thin film transistor layer comprising first and second conductively doped active areas separated by an intervening thin film channel region, the thin film channel region being gated by the transistor gate through a gate insulator, the thin film transistor layer having a thickness;

providing a layer of conductively doped material adjacent the thin film transistor layer;

patterning and etching the conductively doped material to define first and second source/drain blocks;

the first and second source/drain blocks electrically interconnecting with the respective thin film first and second active areas to define composite first and second conductively doped transistor active regions having a thickness which is greater than the thin film layer thickness; and wherein the transistor gate is provided as a bottom gate, and the steps of providing, patterning and etching to define the first and second source/drain blocks comprises:

at least local planarizing in the vicinity of the bottom gate to provide a substantially planar upper bottom gate surface which is substantially co-planar with adjacent upper surfaces;

after local planarizing, providing the thin film transistor layer;

after providing the thin film transistor layer, providing and patterning a masking layer to cover the thin film channel region and upwardly expose the first and second active areas;

after providing the masking layer, providing a layer of polysilicon over the masking layer and first and second active areas; and chemical-mechanical polishing the layer of polysilicon to at least in part define discrete first and second source/drain blocks.

3. The method of forming the bottom gated thin film field effect transistor of claim 2 wherein the active areas and the source/drain blocks constitute the same material.

4. The method of forming the bottom gated thin film field effect transistor of claim 2 wherein the active areas and the source/drain blocks comprise conductively doped silicon.

5. A method of forming a bottom gated thin film field effect transistor comprising the following steps:

providing a bottom gate within a layer of insulating material;

providing first and second electrically conductive source/drain blocks elevationally higher and opposingly adjacent the bottom gate;

providing a gate insulating layer over the bottom gate; and providing a thin film transistor layer over the first and second source/drain blocks and gate insulating layer, the thin film transistor layer electrically interconnecting with the first and second conductive source/drain blocks to define a thin film field effect transistor having opposing source/drain regions with a thickness which is greater than an intervening thin film transistor channel region.

6. The method of forming the bottom gated thin film field effect transistor of claim 5 wherein the gate insulating layer is provided before the first and second source/drain blocks are provided.

7. The method of forming the bottom gated thin film field effect transistor of claim 5 wherein the gate insulating layer is provided after the first and second source/drain blocks are provided.

8. The method of forming the bottom gated thin film field effect transistor of claim 5 wherein the thin film transistor layer and the source/drain blocks constitute the same material.

9. The method of forming the bottom gated thin film field effect transistor of claim 5 wherein the thin film transistor layer and the source/drain blocks comprise conductively doped silicon.

* * * * *

UNITED STATES PATENT AND TRADEMARK OFFICE
CERTIFICATE OF CORRECTION

PATENT NO. : 5,858,821

DATED : January 12, 1999

INVENTOR(S) : Charles H. Dennison; Monte Manning

It is certified that error appears in the above-identified patent and that said Letters Patent are hereby corrected as shown below:

Col. 1, l. 29: Delete "8".

Signed and Sealed this

Thirty-first Day of August, 1999

Attest:

Q. TODD DICKINSON

Attesting Officer

Acting Commissioner of Patents and Trademarks